United States Patent
Sexton et al.

(10) Patent No.: US 6,567,258 B2
(45) Date of Patent: May 20, 2003

(54) HIGH TEMPERATURE ELECTROSTATIC CHUCK

(75) Inventors: Greg Sexton, Fremont, CA (US); Mark Allen Kennard, Pleasanton, CA (US); Alan Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/075,601

(22) Filed: Feb. 15, 2002

(65) Prior Publication Data

US 2002/0075625 A1 Jun. 20, 2002

Related U.S. Application Data

(62) Division of application No. 09/469,287, filed on Dec. 22, 1999, now Pat. No. 6,377,437.

(51) Int. Cl.[7] .............................................. H02N 13/00
(52) U.S. Cl. ....................................... 361/234; 279/128
(58) Field of Search .......................... 361/234; 118/500, 118/728; 279/128; 219/121.48

(56) References Cited

U.S. PATENT DOCUMENTS

| | | | |
|---|---|---|---|
| 4,340,462 A | 7/1982 | Koch ..................... | 204/298.35 |
| 4,534,816 A | 8/1985 | Chen et al. .................. | 156/345 |
| 4,579,618 A | 4/1986 | Celestino et al. ........... | 156/345 |
| 4,615,755 A | 10/1986 | Tracy et al. ................ | 156/345 |
| 4,665,463 A | 5/1987 | Ward et al. ................. | 361/234 |
| 4,692,836 A | 9/1987 | Suzuki ........................ | 361/234 |
| 4,948,458 A | 8/1990 | Ogle ........................... | 156/643 |
| 4,948,462 A | 8/1990 | Rossen ........................ | 361/234 |
| 5,055,964 A | 10/1991 | Logan et al. ................ | 361/234 |
| 5,155,652 A | 10/1992 | Logan et al. ................ | 361/234 |
| 5,160,152 A | 11/1992 | Toraguchi et al. .......... | 427/569 |
| 5,200,232 A | 4/1993 | Tappan et al. .............. | 156/345 |
| 5,221,403 A | 6/1993 | Nozawa et al. ............. | 118/724 |
| 5,238,499 A | 8/1993 | van de Ven et al. .... | 204/298.15 |
| 5,262,029 A | 11/1993 | Erskine et al. .............. | 219/385 |
| 5,280,156 A | 1/1994 | Niori et al. .................. | 156/345 |
| 5,350,479 A | 9/1994 | Collins et al. .............. | 228/189 |
| 5,511,799 A | 4/1996 | Davenport et al. ......... | 228/189 |
| 5,663,865 A | 9/1997 | Kawada et al. ............. | 361/234 |
| 5,671,117 A | 9/1997 | Sherstinsky et al. ........ | 361/234 |
| 5,730,803 A | 3/1998 | Steger et al. ........... | 118/723 R |
| 5,796,066 A | 8/1998 | Guyot .................... | 219/212.48 |
| 5,800,618 A | 9/1998 | Niori et al. .............. | 118/723 E |
| 5,820,723 A | 10/1998 | Benjamin et al. ........... | 156/345 |

(List continued on next page.)

FOREIGN PATENT DOCUMENTS

| | | |
|---|---|---|
| EP | 628644 | 12/1994 |
| WO | 99/36956 | 1/1999 |

*Primary Examiner*—Ronald W. Leja
(74) *Attorney, Agent, or Firm*—Burns, Doane, Swecker & Mathis, LLP

(57) ABSTRACT

A hot electrostatic chuck having an expansion joint between a chuck body and a heat transfer body. The expansion joint provides a hermetic seal, accommodates differential thermal stresses between the chuck body and the heat transfer body, and/or controls the amount of heat conducted from the chuck body to the heat transfer body. A plenum between spaced apart surfaces of the chuck body and the heat transfer body is filled with a heat transfer gas such as helium which passes through gas passages such as lift pin holes in the chuck body for backside cooling of a substrate supported on the chuck. The heat transfer gas in the plenum also conducts heat from the chuck body into the heat transfer body. The chuck body can be made of a material with desired electrical and/or thermal properties such as a metallic material or ceramic material. The chuck can be used in various semiconductor processes such as plasma etching, chemical vapor deposition, sputtering, ion implantation, ashing, etc. The ability to operate the chuck at temperatures in excess of 200° C. allows it to be used for plasma etching of noble metals such as Pt which require etching at high temperatures to volatilize low volatility etch products.

12 Claims, 7 Drawing Sheets

U.S. PATENT DOCUMENTS

| | | |
|---|---|---|
| 5,835,334 A | 11/1998 | McMillin et al. ............ 361/234 |
| 5,851,298 A | 12/1998 | Ishii ........................... 118/728 |
| 5,867,359 A | 2/1999 | Sherman ..................... 361/234 |
| 5,880,922 A | 3/1999 | Husain ....................... 361/234 |
| 5,883,778 A | 3/1999 | Sherstinsky et al. ........ 361/234 |
| 5,908,334 A | 6/1999 | Chen et al. ................. 439/824 |
| 5,922,133 A | 7/1999 | Tepman et al. ............. 118/728 |
| 5,930,639 A | 7/1999 | Schuele et al. ............. 438/396 |
| 5,948,704 A | 9/1999 | Benjamin et al. ........... 438/715 |
| 5,968,273 A | 10/1999 | Kadomura et al. ......... 118/715 |
| 6,239,402 B1 | 5/2001 | Araki et al. ............. 219/121.4 |

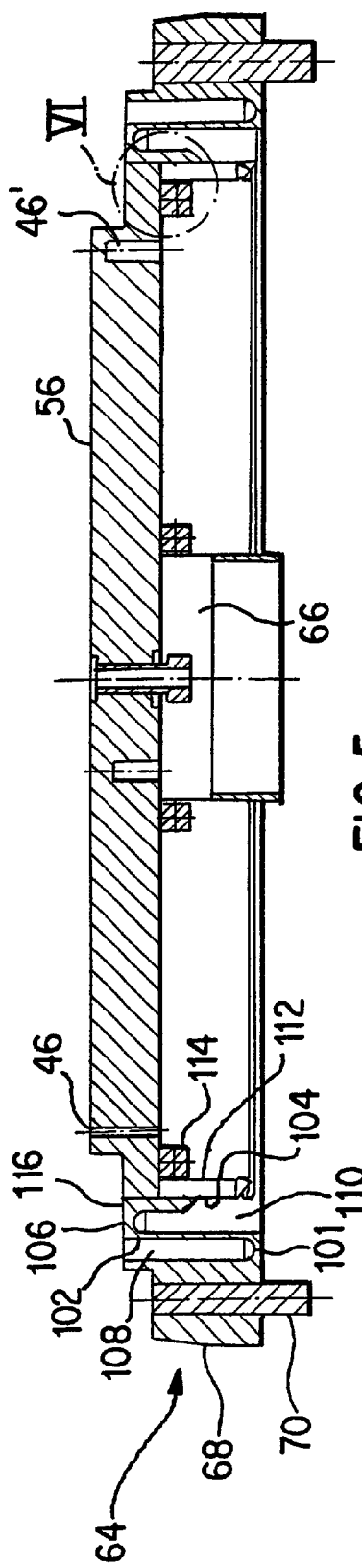
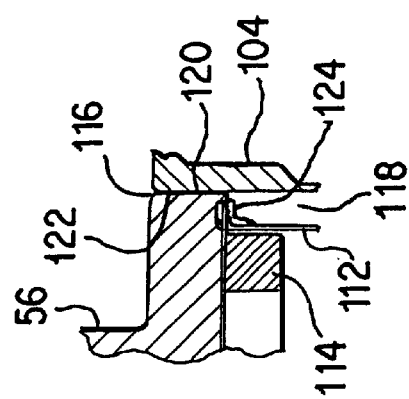

HIGH TEMPERATURE ELECTROSTATIC CHUCK

This application is a divisional of application Ser. No. 09/469,287, filed on Dec. 22, 1999 now U.S. Pat. No. 6,377,437.

FIELD OF THE INVENTION

The invention relates to an electrostatic chuck (ESC) useful for processing substrates such as semiconductor wafers. The ESC can be used to support a semiconductor substrate in a plasma reaction chamber wherein etching or deposition processes are carried out. The ESC is especially useful for high temperature plasma etching of materials such as platinum which are not volatile at low temperatures.

DESCRIPTION OF THE RELATED ART

Vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP) which is also called inductively coupled plasma (ICP), and electron-cyclotron resonance (ECR) reactors are disclosed in commonly owned U.S. Pat. Nos. 4,340,462; 4,948,458; and 5,200,232. Vacuum processing chambers are typically designed to meet performance specifications which depend on the process to be carried out therein. Thus, the particular plasma generating source, vacuum pumping arrangement and substrate support associated with the particular processing chamber must be customized or specially designed to meet the performance specifications.

Substrates are typically held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. Nos. 5,262,029 and 5,671,116. Substrate holders in the form of an electrode can supply radiofrequency (RF) power into the chamber, as disclosed in U.S. Pat. No. 4,579,618.

Substrates including flat panel displays and smaller substrates can be cooled by the substrate holder during certain processing steps. Such cooling is performed by the application of an inert gas, such as helium, between the substrate holder and the opposed surface of the substrate. For instance, see U.S. Pat. Nos. 4,534,816, 5,160,152; 5,238,499; and 5,350,479. The cooling gas is typically supplied to channels or a pattern of grooves in the substrate holder and applies a back pressure to the substrate. Electrostatic chucks of the monopolar type utilize a single electrode. For instance, see U.S. Pat. No. 4,665,463. Electrostatic chucks of the bipolar type utilize mutual attraction between two electrically charged capacitor plates which are separated by a dielectric layer. For instance, see U.S. Pat. Nos. 4,692,836 and 5,055,964.

Substrate supports for vacuum processing chambers are typically mounted on a bottom wall of the chamber making servicing and replacement of the substrate support difficult and time consuming. Examples of such bottom mounted substrate supports can be found in U.S. Pat. Nos. 4,340,462; 4,534,816; 4,579,618; 4,615,755; 4,948,458; 5,200,232; and 5,262,029. A cantilevered support arrangement is described in commonly owned U.S. Pat. Nos. 5,820,723 and 5,948,704.

High temperature electrostatic chucks incorporating clamping electrodes and heater elements have been proposed for use in chemical deposition chambers. See, for example, U.S. Pat. Nos. 5,730,803; 5,867,359; 5,908,334; and 5,968,273 and European Patent Publication 628644 A2. Of these, EP'644 discloses an aluminum nitride chuck body having an RF metallic electrode plate which is perforated with holes to form a mesh and a heater embedded therein, the chuck body being supported on an alumina cylinder such that the outer periphery of the chuck body extends beyond the cylinder. The '803 patent discloses a chuck body of silicon nitride or alumina having an electrical grid of Mo, W, W—Mo and a Mo heater coil wire embedded therein, the chuck body being supported by a Mo heat choke cylinder which surrounds a Cu or Al water cooled cooling plate in thermal contact with the chuck body by a thermal grease which allows differential expansion between the chuck body and the cooling plate. The '359 patent describes a chuck operational at temperatures on the order of 500° C., the chuck including sapphire (single crystal $Al_2O_3$) layers brazed to opposite sides of a niobium electrode and that assembly brazed to a metal base plate. The '334 patent describes a chuck for use at temperatures in excess of 175° C., the chuck including polyimide films on either side of a monopolar or bipolar electrode with the lower polyimide film self adhered to a stainless steel platen. The '273 patent discloses a layered chuck body including an aluminum nitride top layer, an electrode, an aluminum nitride layer, a metal plate, a heater, a metal plate and an aluminum composite, the chuck body being supported by a cylinder such that the outer periphery of the chuck body extends beyond the cylinder.

Some ESC designs use a heat conduction gas such as helium to enhance conduction of heat between adjacent surfaces of the wafer support. For instance, U.S. Pat. No. 5,155,652 describes an ESC having layers including an upper pyrolytic boron nitride layer or optionally polyimide, alumina, quartz, or diamond, an electrostatic pattern layer comprised of a boron nitride substrate and a conductive pattern of pyrolytic graphite thereon, a heater layer comprised of a boron nitride substrate and a conductive pattern of pyrolytic graphite thereon, and a heat sink base of KOVAR™ (NiCoFe alloy with 29% Ni, 17% Co and 55% Fe). The heat sink base includes water cooling channels in a lower portion thereof and chambers in an upper surface thereof which can be maintained under vacuum during heatup of the chuck or filled with helium to aid in cooling of a wafer supported by the chuck. U.S. Pat. No. 5,221,403 describes a support table comprised of an upper member which supports a wafer and a lower member which includes a liquid passage for temperature control of the wafer, the upper member including an ESC constituted by a copper electrode between polyimide sheets and a gap between contacting surfaces of the upper and lower members being supplied a heat conduction gas. Commonly owned U.S. Pat. No. 5,835,334 describes a high temperature chuck wherein helium is introduced between contacting surfaces of a lower aluminum electrode and an electrode cap which is bolted to the lower electrode, the electrode cap comprising anodized aluminum or diamond coated molybdenum. A protective alumina ring and O-ring seals minimize leakage of the coolant gas between the electrode cap and the lower electrode. The electrode cap includes liquid coolant channels for circulating a coolant such as ethylene glycol, silicon oil, FLUORINERT™ or a water/glycol mixture and the lower electrode includes a heater for heating the chuck to temperatures of about 100–350° C. To prevent cracking of the anodization due to differential thermal expansion, the electrode cap is maintained at temperatures no greater than 200° C. In the case of the diamond coated molybdenum electrode cap, the chuck can be used at higher temperatures.

International Publication WO 99/3696 describes a process for plasma etching a platinum electrode layer wherein a substrate is heated to above 150° C. and the Pt layer is etched by a high density inductively coupled plasma of an etchant gas comprising chlorine, argon and optionally $BCl_3$, HBr or mixture thereof. U.S. Pat. No. 5,930,639 also describes a platinum etch process wherein the Pt forms an electrode of a high dielectric constant capacitor, the Pt being etched with an oxygen plasma.

Although there has been some attempts to provide improved chuck designs for use at high temperatures, the high temperatures impose differential thermal stresses which are detrimental to use of materials of different thermal expansion coefficients. This is particularly problematic in maintaining a hermetic seal between ceramic materials such as aluminum nitride and metallic materials such as stainless steel or aluminum. As such, there is a need in the art for improved chuck designs which can accommodate the thermal cycling demands placed upon high temperature chuck materials.

SUMMARY OF THE INVENTION

The invention provides an electrostatic chuck useful in a high temperature vacuum processing chamber comprising a chuck body, a heat transfer body and an expansion joint therebetween. The chuck body comprises an electrostatic clamping electrode and optional heater element, the electrode being adapted to electrostatically clamp a substrate such as a semiconductor wafer on an outer surface of the chuck body. The heat transfer body is separated from the chuck body by a plenum located between spaced apart surfaces of the chuck body and the heat transfer body, the heat transfer body being adapted to remove heat from the chuck body by heat conductance through a heat transfer gas in the plenum. The expansion joint attaches an outer periphery of the chuck body to the heat transfer body, the expansion joint accommodating differential thermal expansion of the chuck body and the heat transfer body while maintaining a hermetic seal during thermal cycling of the chuck body.

According to a preferred embodiment, the heat transfer body comprises a cooling plate having at least one coolant passage therein in which coolant can be circulated to maintain the chuck body at a desired temperature and the plenum is an annular space extending over at least 50% of the underside of the chuck body. In this embodiment, the heat transfer body includes a gas supply passage through which heat transfer gas flows into the annular space. According to a preferred embodiment, the chuck body includes gas passages extending between the plenum and the outer surface of the chuck body. The gas passages can be provided in any suitable arrangement. For instance, if the outer portion of the chuck body tends to become hotter than the central portion thereof, the gas passages can be located adjacent to the expansion joint so that the heat transfer gas flows from the plenum to the underside of an outer periphery of the substrate during processing thereof.

According to the preferred embodiment, the chuck body comprises a metallic material such as aluminum or alloy thereof or a ceramic material such as aluminum nitride. In the case of a ceramic chuck body, the expansion joint can comprise a thin metal section brazed to the ceramic chuck body. Lift pins can be used to raise and lower a substrate. For instance, the heat transfer body can include lift pins such as cable actuated lift pins mounted thereon, the lift pins being movable towards and away from the chuck body such that the lift pins travel through holes in the chuck body to raise and lower a substrate onto and off of the chuck body.

The expansion joint can include a mounting flange adapted to attach to the heat transfer body and a heat choke such as a single or multi-piece flexible metal part. The heat choke can include inner and outer annular sections interconnected by a curved section, the inner annular section being attached to the chuck body and the outer annular section being attached to the mounting flange. The expansion joint can also include a connecting member such as a thin ring attached at one end to an outer periphery of the chuck body by a joint such as a mechanical joint or metallurgical joint such as a brazed joint, the connecting member being of a metal having a coefficient of thermal expansion close enough to that of the chuck body to prevent failure of the joint during thermal cycling of the chuck body. Further, the expansion joint can include a thermal expansion section which abuts an outer edge of the chuck body, the thermal expansion section being thermally expandable and contractible to accommodate changes in dimensions of the chuck body.

The chuck body can include a ceramic or metallic tubular section extending from a central portion of the underside of the chuck body such that an outer surface of the tubular section defines a wall of the plenum, the tubular section being supported in floating contact with the heat transfer body with a hermetic seal therebetween. The interior of the tubular section can include power supplies supplying RF and DC power to the clamping electrode and AC power to the heater element, and/or a temperature measuring arrangement for monitoring temperature of the chuck body.

According to an embodiment of the invention, the chuck is a replaceable electrostatic chuck for a vacuum processing chamber wherein the chuck includes a chuck body and an expansion joint. The chuck comprises an electrode having an electrical contact attachable to an electrical power supply which energizes the electrode sufficiently to electrostatically clamp a substrate on an outer surface of the chuck body. The expansion joint includes a first portion attached to an outer periphery of the chuck body and a second portion removably attachable to a heat transfer body such that a plenum is formed between spaced apart surfaces of the chuck body and the heat transfer body.

The invention also provides a method of processing a substrate in a vacuum process chamber wherein the substrate is electrostatically clamped on a chuck body comprising a clamping electrode and an expansion joint attaching an outer periphery of the chuck body to a heat transfer body such that a plenum is formed between spaced apart surfaces of the chuck body and the heat transfer body, the method comprising clamping a substrate on an outer surface of the chuck body by energizing the electrode, supplying a heat transfer gas to the plenum, the heat transfer gas in the plenum passing through gas passages in the chuck body to a gap between an underside of the substrate and the outer surface of the chuck body, removing heat from the chuck body by heat conductance through the heat transfer gas supplied to the plenum, and processing the substrate.

According to a preferred embodiment, the method further comprises supplying process gas to the chamber and energizing the process gas into a plasma and etching an exposed surface of the substrate with the plasma during the processing step. However, an exposed surface of the substrate can be coated during the processing step. The process gas can be energized into the plasma by any suitable technique such as supplying radiofrequency energy to an antenna which inductively couples the radiofrequency energy into the chamber. During the processing step, the substrate can be heated by supplying power to a heater element embedded in the chuck body. Prior to clamping the substrate, the substrate can be lowered onto the outer surface of the chuck body with lift pins mounted on the heat transfer body, the lift pins passing through openings in an outer portion of the chuck body. In order to withdraw heat from the chuck body, the method can include circulating a liquid coolant in the heat transfer body. Temperature changes in the substrate can be monitored with a temperature sensor supported by the heat transfer body and extending through a hole in the chuck body. In the case of plasma etching a layer of platinum during the processing step, the substrate can be heated to a temperature of over 200° C.

According to the method, it is possible to achieve a desired heat distribution across the chuck body by removing heat from the chuck body through multiple heat paths. Further, it is possible to adjust the amount of heat removed through these heat paths by changing the pressure of the heat transfer gas in the plenum. For instance, since the ceramic or metallic tubular extension at a central portion of the underside of the chuck body conducts heat from the chuck body to the heat transfer body, the method can include adjusting pressure of the heat transfer gas in the plenum so that heat removed through a first heat path provided by the heat transfer gas in the plenum balances heat removed through a second heat path provided by the expansion joint and heat removed through a third heat path provided by the tubular extension.

BRIEF DESCRIPTION OF THE DRAWINGS

The invention will be described in greater detail with reference to the accompanying drawings in which like elements bear like reference numerals, and wherein:

FIG. 5 shows details of a portion of the HTESC assembly shown in FIG. 4;

FIG. 6 shows an enlarged view of a portion of the chuck body shown in FIG. 5;

DETAILED DESCRIPTION OF THE PREFERRED EMBODIMENTS

Figure 1:
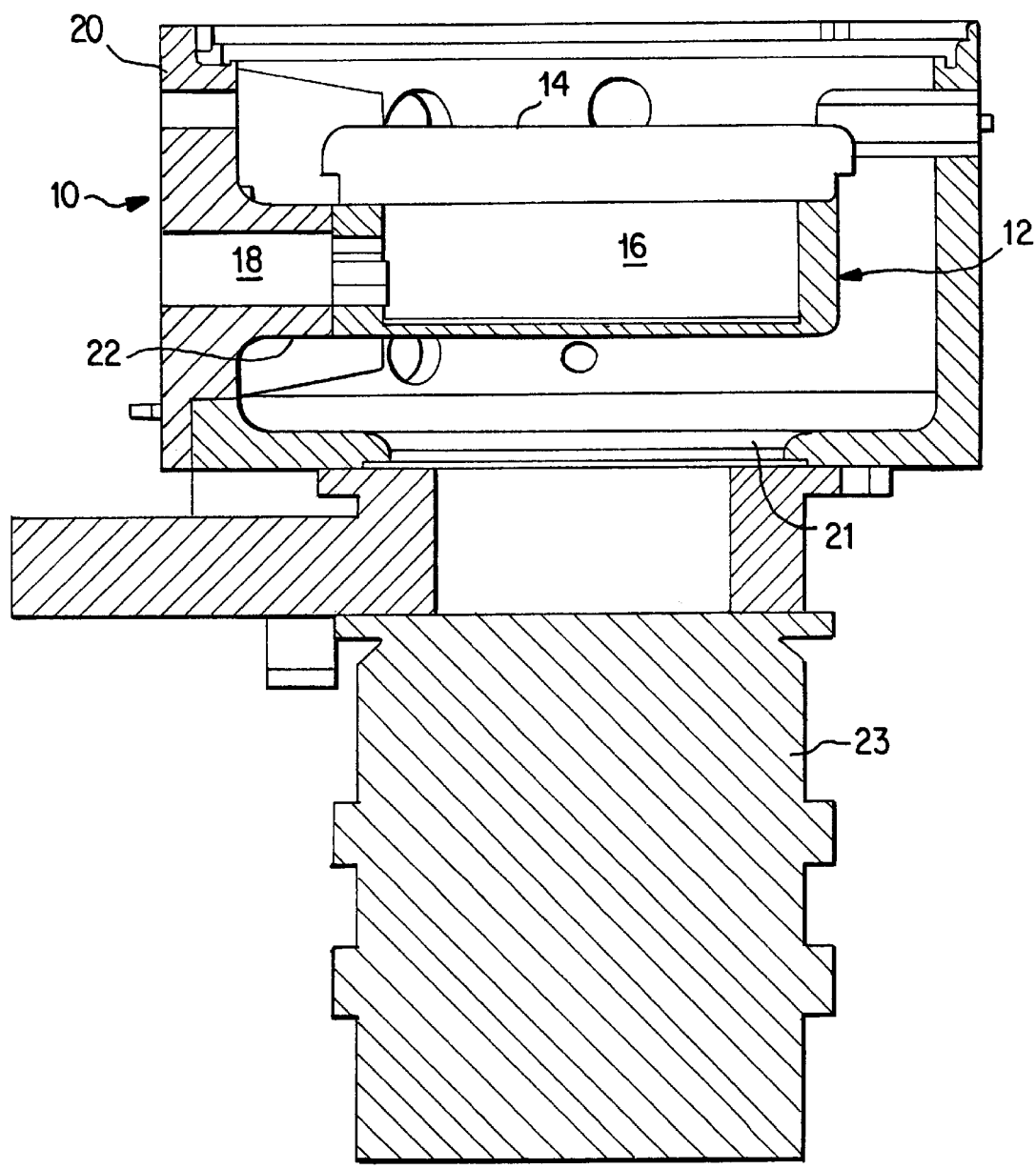
FIG. 1 shows a cross-section of a vacuum processing chamber in which a HTESC assembly of the present invention can be implemented.

The invention provides an electrostatic chuck useful for clamping substrates such as semiconductor wafers during processing thereof in a vacuum processing chamber such as a plasma etch reactor. The electrostatic chuck, however, can be used for other purposes such as clamping substrates during chemical vapor deposition, sputtering, ion implantation, resist stripping, etc.

According to a preferred embodiment of the invention, the chuck includes a is clamping electrode and an optional heating element which can be used to maintain the substrate supported on the chuck at elevated temperatures above 80° C. (the upper limit of certain conventional chucks is 60° C.), preferably over 200° C., for example 250 to 500° C. For example, the chuck can be used to support a wafer during chemical vapor deposition or plasma etching of materials wherein it is necessary to heat the substrate to temperatures on the order of about 150° C. and above. In order to achieve such high temperatures without damage to the chuck, the chuck includes an expansion joint design which provides the chuck with high temperature functionality in a small package.

According to the preferred embodiment, the expansion joint creates a plenum between spaced apart surfaces of an actively heated portion of the chuck and an actively cooled portion of the chuck. The plenum is filled with a heat transfer gas to conduct heat from the heated portion to the cooled portion of the chuck. With this arrangement, it is not necessary to use any elastomer seals in the heated portion of the chuck, thereby allowing the heated portion of the chuck to operate at temperatures above which elastomer seals would break down. Also, because of the plenum and a heat choke portion of the expansion joint, the cooled portion of the chuck can be maintained at a low enough temperature to permit use of low cost elastomer seals in contact with surfaces of the cooled portion of the chuck. Moreover, the expansion joint design provides a small overall height of the chuck which makes the chuck compatible with tight system packaging requirements (footprint). A further advantage of the expansion joint is that thermal stresses can be accommodated between the heated and cooled portions of the chuck. In addition, a heat transfer gas such as helium can be supplied to targeted locations on the underside of the substrate without the need for a complicated arrangement of gas passages inside the chuck.

According to a preferred method of using the chuck according to the invention, a low volatility etch product can be removed from a substrate by a plasma etch process wherein the substrate is heated by the chuck. Such low volatility etch products can be formed during plasma etching of noble metals such as Pt, Pd, Ru and Ir, materials under consideration for the electrodes of capacitors using high-k dielectric materials. Such low volatility etch products remain on the substrate surface unless the substrate is heated sufficiently. For example, platinum chloride formed during etching of platinum can be volatilized by heating the substrate to around 300° C. Conventional chucks used in low temperature etch processes are unsuited for such high temperature environments since they can undergo damaging thermal cycling which ruptures hermetic seals and/or causes failure of chuck materials. Further, because the water cooled portions of such chucks are in direct thermal contact with the heated portion of the chuck, the heat from the chuck can cause the cooling fluid to boil and result in uneven cooling of the chuck and/or insufficient cooling of the chuck. The chuck according to the invention solves these problems through use of the expansion joint design.

According to a preferred embodiment, the chuck body is made from a metallic or ceramic material having desired electrical and/or thermal properties. For example, the chuck body can be made of aluminum or an aluminum alloy.

Alternatively, the chuck body can be made from one or more ceramic materials including nitrides such as aluminum nitride, boron nitride and silicon nitride, carbides such as silicon carbide and boron carbide, oxides such as alumina, etc. with or without fillers such as particles in the form of whiskers, fibers or the like or infiltrated metals such as silicon. A ceramic chuck body can be formed by various techniques. For instance, the ceramic material can be formed into a monolithic body by a powder metallurgical technique wherein ceramic power is formed into a chuck body shape such as by compacting or slip casting the powder with the clamping electrode, heater and power supply connections embedded therein, the chuck body being densified by sintering the powder. Alternatively, the chuck body can be formed from sheets of ceramic material which are overlaid with electrically conductive patterns for the clamping electrode, the heater and power feedthroughs incorporated therein, the layers being cofired to form the final chuck body.

Two embodiments of a high temperature electrostatic chuck (HTESC) assembly according to the invention are now described with reference to FIGS. 1–9. The HTESC assembly offers advantageous features such as high temperature functionality, relatively low power requirements, longer operational life, simple backside cooling, lower manufacturing cost and compact design.

The HTESC according to the invention can offer better high temperature functionality and relatively low power requirements compared to conventional chuck assemblies wherein a cooling plate is integrated as a one-piece electrostatic chuck. In such conventional chuck arrangements, the maximum operational temperature is limited to approximately 60° C. In order to increase the maximum operational temperature, the HTESC of the present invention has been designed as a two-piece assembly, including an ESC portion such as a ceramic chuck body having an electrostatic clamping electrode embedded therein and a heat transfer body such as a cooling plate. In addition, an expansion joint in the form of heat break tubulations have been integrated into the ESC portion for thermally isolating the ESC portion from the cooling plate. The heat break tubulations significantly reduce conduction of heat from a peripheral edge of the ESC portion to the cooling plate, thereby allowing the ESC portion to reach temperatures as high as approximately 500° C. without requiring the supply of a relatively large amount of power to a heater element embedded in the chuck body.

The expansion joint provides a long operational life of the HTESC. In particular, by use of the heat break tubulations, the ESC portion can undergo extensive thermal expansion without damaging other parts of the HTESC. The heat break tubulations can be designed as a one-piece metal part or a multi-piece welded or brazed assembly which includes one or more thin-walled sections which allow thermal expansion and contraction of the ESC portion while minimizing heat transfer from the ESC portion to the cooling plate. The heat break tubulations accommodate differential thermal expansion between the ESC portion and the cooling plate, thereby minimizing stresses within the HTESC assembly and thus reducing the chance of premature failure of the HTESC assembly. Furthermore, the heat break tubulations can be designed in a manner which reduces stress at brazed joints within the HTESC assembly.

Compared to conventional chuck assemblies which rely on a complicated gas distribution arrangement inside the ESC portion to adequately cool the substrate, the HTESC according to the present invention includes a simple arrangement which can selectively target portions of the substrate where more cooling is desired. For instance, the HTESC assembly includes a plenum between the ESC portion and the cooling plate and the plenum can serve the dual function of (1) withdrawing heat from the ESC portion by supplying a heat transfer gas to the plenum and (2) distributing heat transfer gas to select portions of the substrate through gas passages extending from the plenum to the outer surface of the ESC portion. In a HTESC used for plasma etching, gas distribution holes can be provided near the outer periphery of the ESC portion to enhance the cooling of the outer portion of the substrate. Thus, a complicated gas distribution arrangement is not necessary since the gas distribution holes can be formed by holes at desired locations in the support surface of the ESC portion.

Compared to high temperature chuck assemblies which utilize expensive metal seals and/or welded bellows arrangements to provide vacuum seals, the use of the expansion joint in the HTESC assembly of the present invention can reduce manufacturing costs and/or simplify manufacture of the HTESC. In particular, because the heat break tubulations thermally isolate the hot ESC portion from the cooling plate, standard low cost elastomer seals can be used at locations in contact with the cooling plate.

Figure 2:
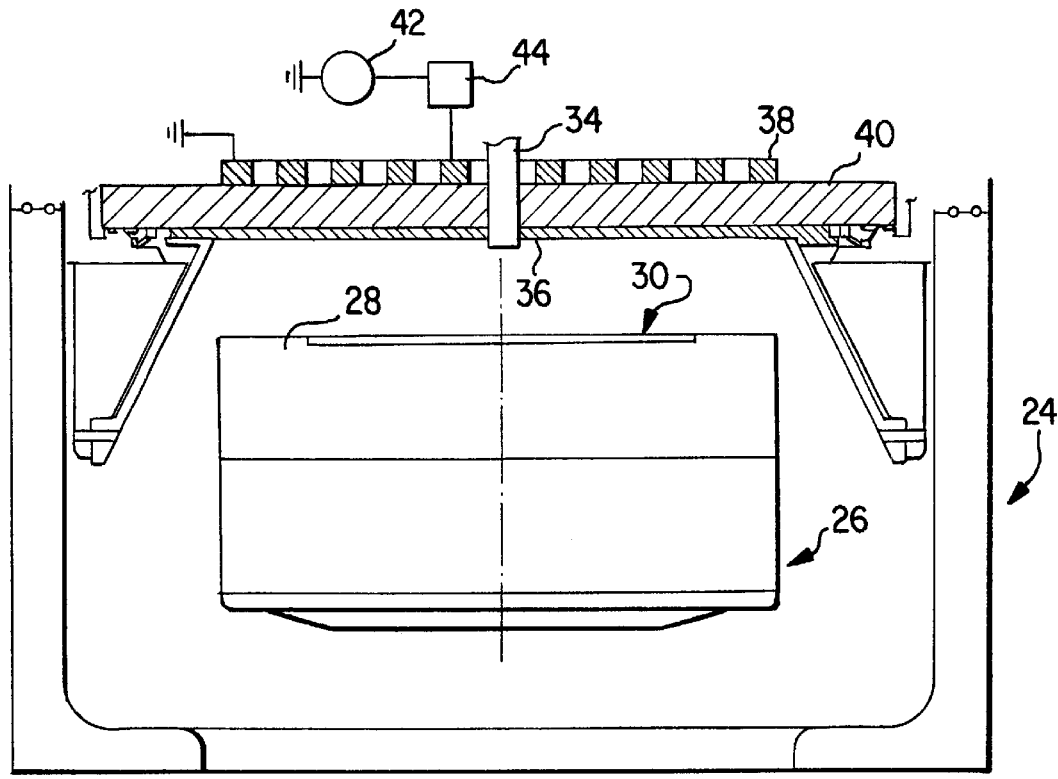
FIG. 2 shows a cross-section of another processing chamber in which the HTESC assembly of the present invention can be implemented.
Figure 3:
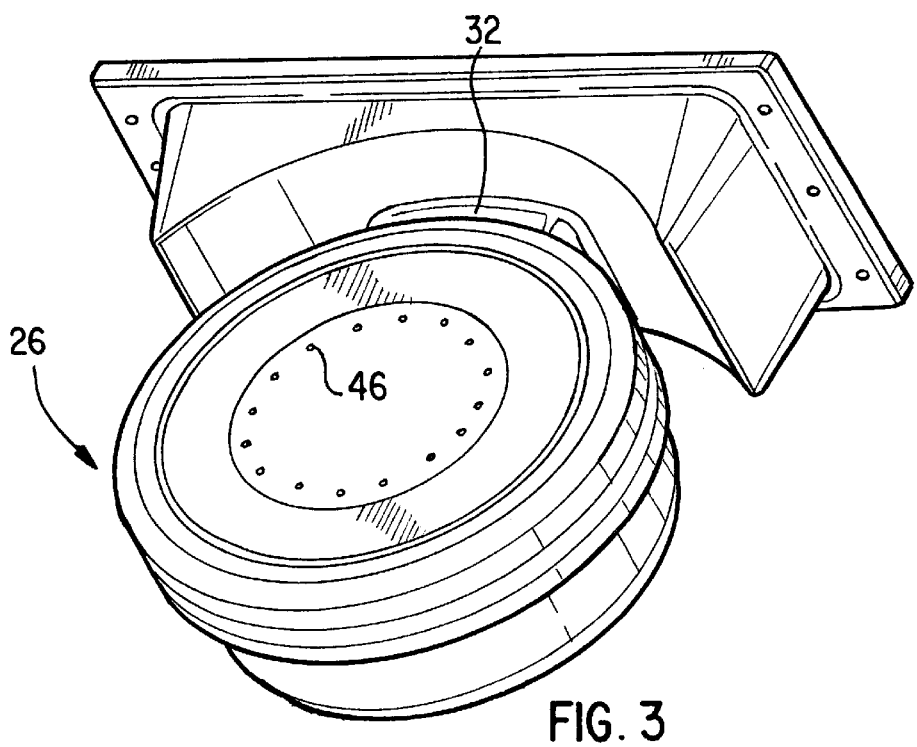
FIG. 3 shows a perspective view of the cantilevered substrate support of FIG. 2.

The HTESC according to the invention is designed to provide a small overall height so that it can be used in vacuum chambers wherein the chuck is supported on a cantilevered support arm. For example, FIGS. 1–3 illustrate examples of vacuum processing chambers 10, 24 into which the HTESC assembly of the present invention could be mounted. While the invention will be explained with reference to the chamber design shown in FIGS. 1–3, it will be appreciated by those skilled in the art that the HTESC assembly of the present invention can be used in any vacuum processing chamber wherein it is desired to electrostatically clamp a substrate. For example, the HTESC assembly of the present invention could be used as part of a substrate support in processing chambers where various semiconductor plasma or non-plasma processing steps such as etching, deposition, resist stripping, etc. can be performed.

As shown in FIG. 1, the vacuum chamber 10 includes a cantilevered substrate support 12 extending inwardly from a sidewall of the chamber and a HTESC 14 is supported by the support. A service passage 18 containing service conduits (not shown) opens into an interior of the support housing 16. The service conduits can be used to service the HTESC, e.g., supply DC power to a clamping electrode, supply RF power to the clamping electrode or a separate electrode which provides an RF bias to the substrate during processing thereof, supply AC power to a heater element, house cables for actuating lift pins, supply coolant for cooling the HTESC and/or the substrate, transmit electrical signals from sensors or monitoring equipment, etc.

In the embodiment shown, a mounting flange 20 and support arm 22 form an integral piece which can be removably mounted in an opening in the chamber, e.g., by mechanical fasteners with an O-ring and RF shielding interposed between opposed surfaces of the flange 20 and the chamber. In the arrangement shown in FIG. 1, gas within the chamber can be withdrawn through an opening 21 by a vacuum pump 23. Plasma can be generated in the chamber by a source of energy (not shown) mounted at the top of the chamber. That is, the top of the chamber is designed to support various types of plasma generating sources such as capacitive coupled, inductive coupled, microwave, magnetron, helicon, or other suitable plasma generating equipment. Also, process gas can be supplied to the chamber by various types of gas supply arrangements such as a gas distribution plate (showerhead), one or more gas rings and/or gas injectors, or other suitable arrangement.

FIG. 2 illustrates a vacuum processing chamber 24 and a cantilevered substrate support 26 on which a chuck assembly 28 has been mounted. As shown, a substrate 30 is supported on a HTESC assembly 28 mounted on a substrate support 26. The substrate support 26 is at one end of a support arm 32 (shown in FIG. 3) mounted in a cantilever fashion such that the entire substrate support/support arm assembly 26/32 can be removed from the chamber by passing the assembly through an opening (not shown) in the sidewall of the chamber 24. Process gas can be supplied to the chamber by any suitable arrangement such as a gas supply pipe 34 or a gas distribution plate 36 and the gas can be energized into a plasma state by an antenna 38 such as a planar coil which inductively couples Rf energy through a dielectric member 40. The antenna can be supplied RF energy by any suitable arrangement such as a conventional RF power generator 42 and a match network 44. During processing of a wafer, a heat transfer gas such as helium can be supplied to the backside of the wafer through holes 46, as shown in FIG. 3.

In the chambers shown in FIGS. 1–3, it is desirable to minimize the height of the HTESC to allow easy removal of the substrate support 26 including the HTESC from the chambers 10, 24. Details of how the HTESC can be made in a compact design will now be explained with reference to the embodiments shown in FIGS. 4–9.

Figure 4:
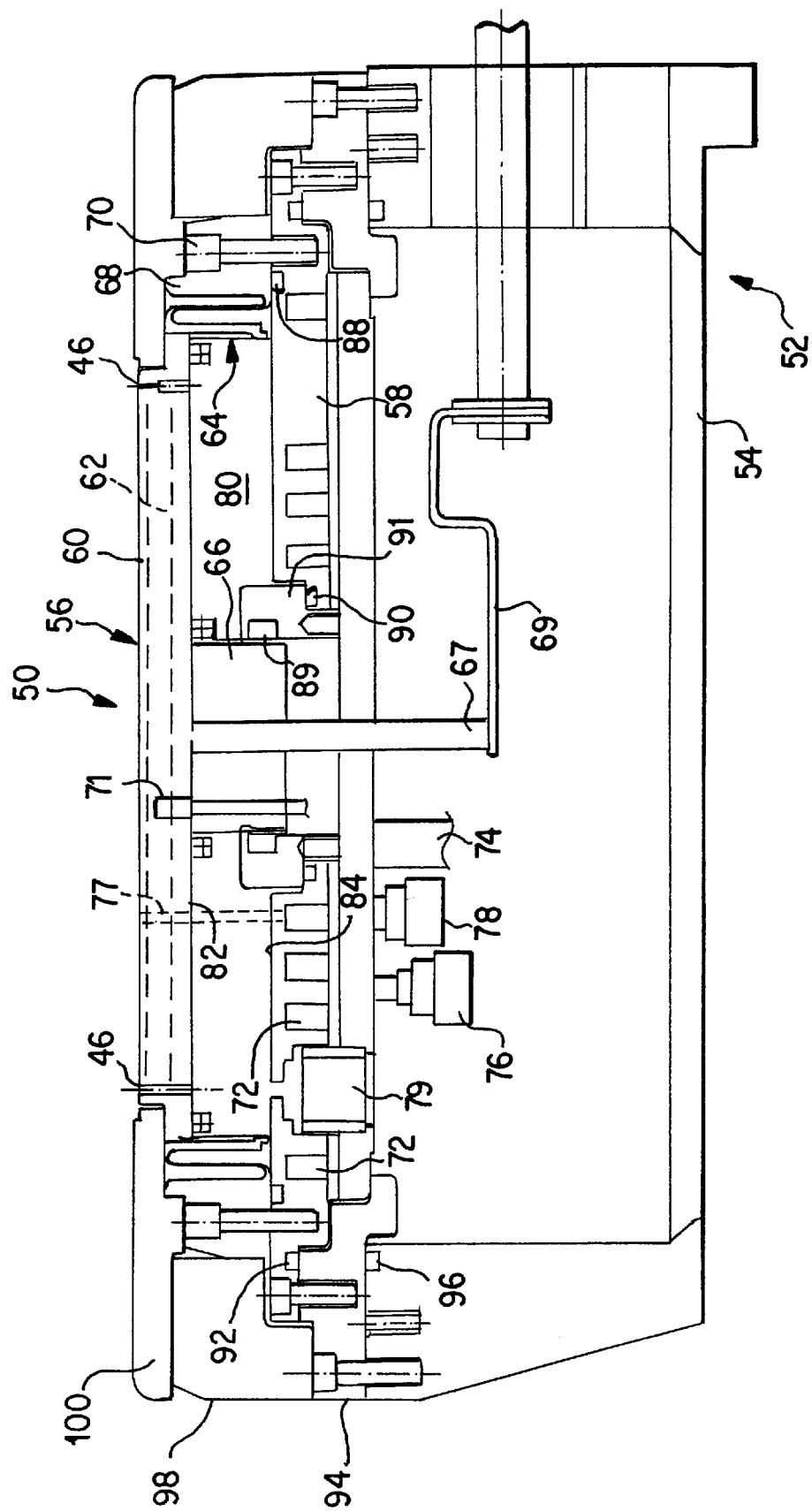
FIG. 4 shows a cross-section of a HTESC assembly of a first embodiment of the present invention.

FIG. 4 shows a HTESC assembly 50 according to a first embodiment of the present invention wherein the HTESC assembly 50 is mounted on a cantilevered substrate support 52 in a vacuum processing chamber, as discussed above with reference to FIGS. 1–3. The HTESC assembly 50 is a two-piece design including a chuck body 56 and a heat transfer body 58. The chuck body 56 includes a clamping electrode 60, an optional heater element 62, an expansion joint 64, and a central tubular extension 66. The expansion joint 64 includes an annular mounting flange 68 which is removably attached to the heat transfer body 58 by bolts 70. The chuck body 56 is preferably made of a ceramic material exhibiting dielectric properties such as aluminum nitride. The expansion joint 64 and the heat transfer body 58 can be made of heat conducting metals such as aluminum, copper, titanium and alloys thereof, but a preferred material is a low heat conducting metal such as stainless steel, cobalt, nickel, molybdenum, zirconium or alloys thereof. Alternatively, the expansion joint 64 and the heat transfer body can be made of any materials compatible in a vacuum chamber in which semiconductor substrates are processed.

The heat transfer body includes coolant passages and coolant such as water or other coolant can be supplied to the passages 72 by suitable conduits one of which is shown at 74. Electrical power can be supplied to the clamping electrode 60 and the heater element 62 by power supply lines in tubular extension 66. For instance, RF and DC power can be supplied to the clamping electrode by a rod 67, the bottom of which is connected to a strap 69. Temperature of the chuck body can be monitored with a temperature feedback assembly 71 in the tubular extension 66.

A plenum 80 is provided between spaced apart surfaces 82 and 84 of the chuck body 56 and the heat transfer body 58. A heat transfer gas such as helium can be supplied to the plenum 80 by a gas conduit 76. The temperature of the substrate on the chuck body can be monitored with a fiberoptic element 77 supported in a fitting 78. Although any type of lift pin assembly can be used such as a pneumatically actuated lift pin assembly, according to a preferred embodiment a fitting mounted in a bore 79 can be used to support a cable actuated lift pin assembly. Elastomer seals 88 and 90 fitted in grooves in the heat transfer body 58 and an elastomer seal 89 fitted in a collar 91 surrounding tubular extension 66 provide vacuum seals between the expansion joint 64 and the heat transfer body 58 and between the tubular extension 66 and the heat transfer body 58. An elastomer seal 92 provides a vacuum seal between an underside of the heat transfer body 58 and a dielectric mounting plate 94 and an elastomer seal 96 provides a vacuum seal between an underside of the mounting plate 94 and the housing 54. A dielectric edge ring 98 (e.g., alumina, silicon nitride, quartz, etc.) overlies the mounting plate 94 and a dielectric focus ring 100 (e.g., alumina, silicon nitride, silicon carbide, etc.) overlies the edge ring 98 and surrounds the chuck body 56.

FIG. 5 shows details of the chuck body 56 with the expansion joint 64 attached thereto and FIG. 6 is an enlarged view of a brazed joint (detail VI in FIG. 5) between the chuck body 56 and the expansion joint 64. As shown in FIG. 5, the expansion joint 64 includes the mounting flange 68, an outer annular section 102, and an inner annular section 104, the outer section 102 being connected to the flange 68 by a curved section 101 and the inner section 104 being connected to the outer section 102 by a curved section 106. The outer section 102 is separated from the flange 68 by an annular space 108 and the inner section 104 is separated from the outer section 102 by an annular space 110. The flange 68, the outer section 102 and the inner section 104 can be formed (e.g., machined, cast, forged, etc.) out of a single piece of metal such as stainless steel. Alternatively, the expansion joint can be made from a multi-piece welded or brazed assembly.

The expansion joint can also include a thin metal ring 112 which is welded at its bottom to the bottom of the inner section 104 and brazed at its top to the underside of the chuck body 56. For added joint strength, a small ceramic ring 114 can be brazed to adjoining surfaces of the chuck body and the ring 112. If aluminum nitride is chosen for the chuck body, the ring 112 can be of a NiCoFe alloy such as KOVAR™ which has a similar coefficient of thermal expansion as aluminum nitride. As shown in FIG. 6, a small gap 116 (e.g., 0.002–0.004 inch) is located between an inner surface 120 of the inner section 104 and an outer sidewall 122 of the chuck body 56. The ceramic ring 114 is set back from the sidewall 122 such that a gap 118 is provided between the ring 112 and the inner section 104, the gap providing sufficient area to accommodate a brazed joint 124 between the ring 112 and the underside of the chuck body 56. If desired, the brazed joint can be replaced with a mechanical joint.

When the chuck body 56 heats up and expands, the sidewall of the chuck body 56 presses against the inner section 104 and elastically deflects the inner and outer sections of the expansion joint. As a result, bending of the ring 112 and consequent stress on the brazed joint 124 can be minimized. Likewise, less stress is placed on the welded joint between the ring 112 and the inner section 104. Instead, the curved sections 106 and 110 allow elastic deflection of the inner and outer sections of the expansion joint to accommodate thermal expansion and contraction of the chuck body 56.

Figure 7:
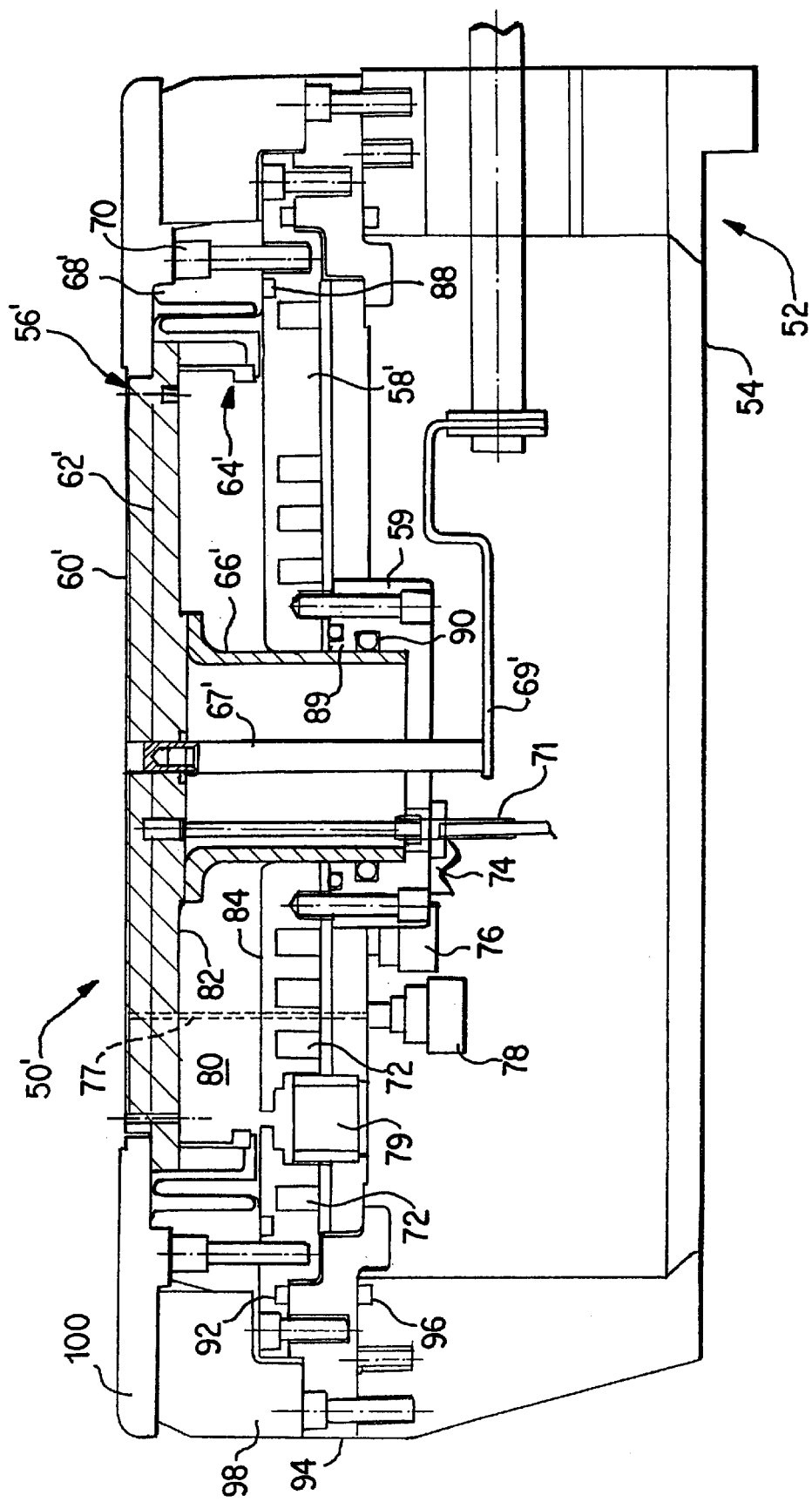
FIG. 7 shows a cross-section of a HTESC assembly of a second embodiment of the present invention.

FIG. 7 shows a HTESC assembly 50' according to a second embodiment of the present invention wherein the HTESC assembly 50' is mounted on a cantilevered substrate support 52 in a vacuum processing chamber, as discussed above with reference to FIGS. 1–3. The HTESC assembly 50' is a two-piece design including a chuck body 56'and a heat transfer body 58'. The chuck body 56' includes a clamping electrode 60', an optional heater element 62', an expansion joint 64', and a central tubular extension 66'. The expansion joint 64' includes an annular mounting flange 68' which is removably attached to the heat transfer body 58' by bolts 70. The chuck body 56' is preferably made of a ceramic material exhibiting dielectric properties such as aluminum nitride. The expansion joint 64' and the heat transfer body 58' can be made of heat conducting metals such as aluminum, copper, titanium and alloys thereof, but a preferred material is a low heat conducting metal such as stainless steel, cobalt, nickel, molybdenum, zirconium or alloys thereof. Alternatively, the chuck body 56', the expansion joint 64' and the heat transfer body can be made of any materials compatible in a vacuum chamber in which semiconductor substrates are processed.

The heat transfer body 58' includes coolant passages 72 and coolant such as water or other coolant can be supplied to the passages 72 by conduits one of which is shown at 74. Electrical power can be supplied to the clamping electrode 60' and the beater element 62' by power supply lines in tubular extension 66'. For instance, RF and DC power can be supplied to the clamping electrode by a rod 67', the bottom of which is connected to a strap 69'. Temperature of the chuck body can be monitored with a temperature feedback assembly 71 in the tubular extension.

A plenum 80 is provided between spaced apart surfaces 82 and 84 of the chuck body 56' and the heat transfer body 58'. A heat transfer gas such as helium can be supplied to the plenum 80 by a gas conduit 76. The temperature of the substrate on the chuck body can be monitored with a fiberoptic element 77 supported in a fitting 78. Although any type of lift pin assembly can be used such as a pneumatically actuated lift pin assembly, according to a preferred embodiment a fitting mounted in a bore 79 can be used to support a cable actuated lift pin. Elastomer seals 88, 89 and 90 fitted in grooves in the heat transfer body 58' and a casing 59 bolted to the heat transfer body 58' provide vacuum seals between the expansion joint 64' and the heat transfer body 58' and between the tubular extension 66' and the casing 59. An elastomer seal 92 provides a vacuum seal between an underside of the heat transfer body 58' and a dielectric mounting plate 94 and an elastomer seal 96 provides a vacuum seal between an underside of the mounting plate 94 and the housing 54. A dielectric edge ring 98 (e.g., alumina, silicon nitride, quartz, etc.) overlies the mounting plate 94 and a dielectric focus ring 100 (e.g., alumina, silicon nitride, silicon carbide, etc.) overlies the edge ring 98 and surrounds the chuck body 56'.

Figure 8:
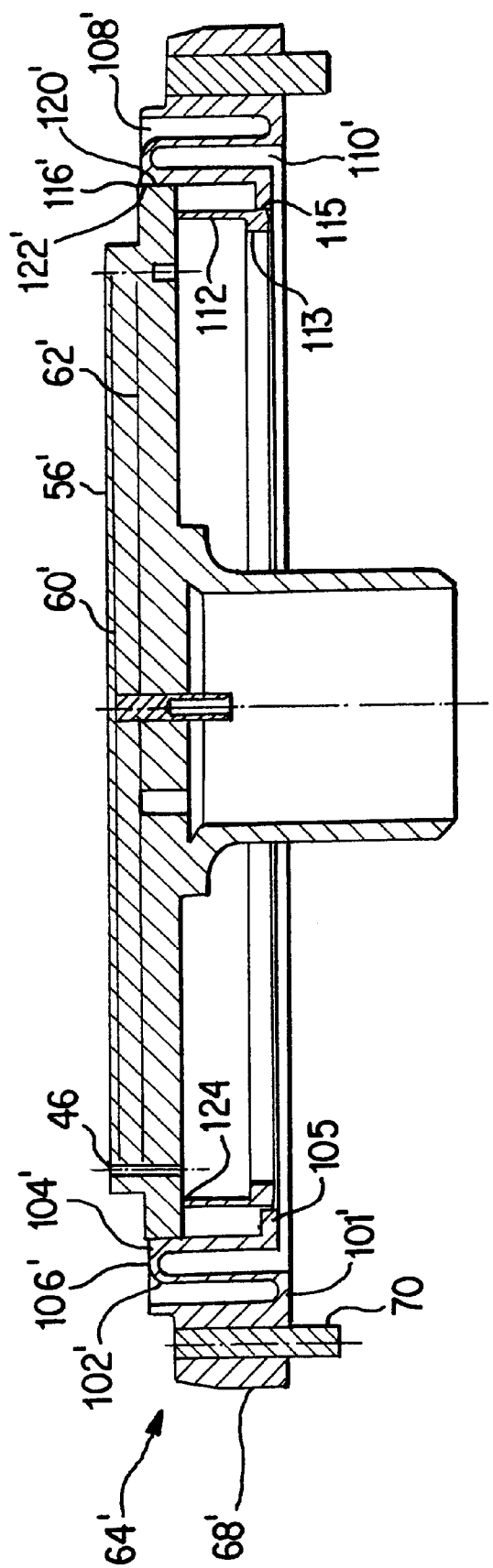
FIG. 8 shows details of a portion of the HTESC assembly shown in FIG. 6.

FIG. 8 shows details of the chuck body 56' with the expansion joint 64' attached thereto. As shown in FIG. 8, the expansion joint 64' includes the mounting flange 68', an outer annular section 102', and an inner annular section 104', the outer section 102' being connected to the flange 68' by a curved section 101' and the inner section 104' being connected to the outer section 102' by a curved section 106'. The outer section 102' is separated from the flange 68' by an annular space 108' and the inner section 104' is separated from the outer section 102' by an annular space 110'. The flange 68', the outer section 102' and the inner section 104' can be formed (e.g., machined, cast, forged, etc.) out of a single piece of metal such as stainless steel or a multi-piece welded or brazed assembly of one or more metals such as stainless steel.

The expansion joint 64' can also include a thin metal ring 112' which has a flange 113 at its bottom welded to a lip of an extension 105 on the bottom of the inner section 104'. The ring 112' is brazed at its top to the underside of the chuck body 56'. Alternatively, the ring 112' can be mechanically attached to the chuck body. If aluminum nitride is chosen for the chuck body, the ring 112' can be of a NiCoFe alloy such as KOVAR™ which has a similar coefficient of thermal expansion as aluminum nitride. A small gap 116 (e.g., 0.002–0.004 inch) is located between an inner surface 120' of the inner section 104' and an outer sidewall 122' of the chuck body 56'.

When the chuck body 56' heats up and expands, the sidewall 122' of the chuck body 56' presses against the surface 120' of the inner section 104' and elastically deflects the inner and outer sections of the expansion joint 64'. As a result, bending of the ring 112' and consequent stress on the brazed joint at the top of the ring 112' can be minimized. Likewise, less stress is placed on the welded joint 115 between the ring 112' and the inner section 104'. Instead, the curved sections 106' and 110' allow elastic deflection of the inner and outer sections of the expansion joint 64' to accommodate thermal expansion and contraction of the chuck body 56'.

Figure 9:
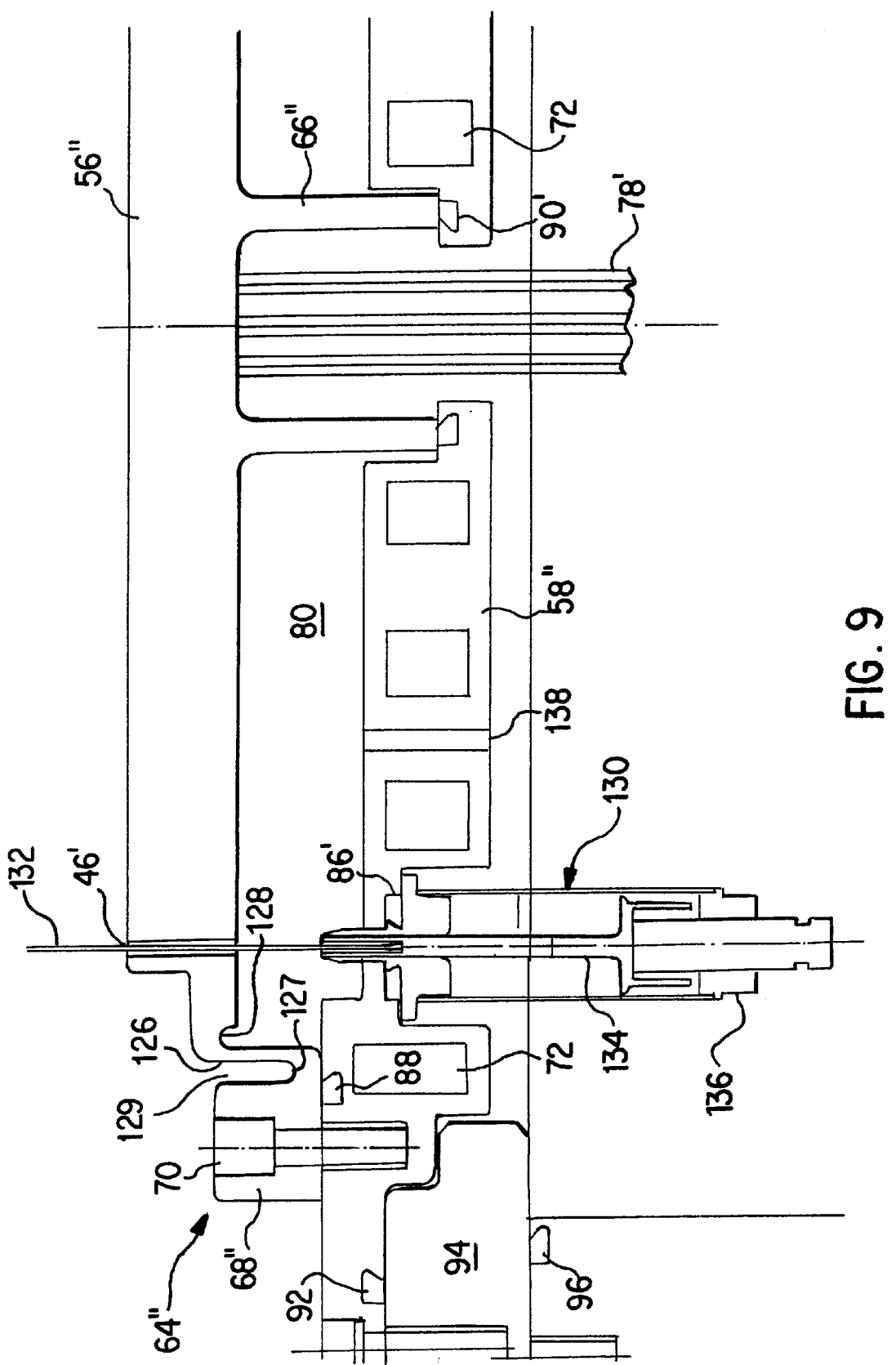
FIG. 9 shows a cross-section of a portion of a HTESC in accordance with a third embodiment of the invention.

FIG. 9 shows another HTESC in accordance with the invention wherein the expansion joint 64" includes a single annular thin walled section 126 connected to the mounting flange 68" by a curved section 127 and connected to the chuck body 56" by a curved section 128. The section 126 is separated from the flange 68" by an annular space 129. The substrate can be raised and lowered with any suitable lift pin arrangement such as a pneumatically actuated lift pin assembly or a cable actuated assembly. In the embodiment shown, the lift pin assembly includes a plurality of cable actuated lift pins located at circumferentially spaced apart locations around the periphery of the chuck body 56". For instance, a plurality of cable actuated lift pin assemblies 130 can be located close to the expansion joint 64", as shown in FIG. 9.

The lift pin assembly 130 includes a lift pin 132 which can be raised and lowered by a cable (not shown) attached to a slidable lift pin support 134 in a housing 136. The housing 136 is fitted in the bore 86' so as to maintain a hermetic seal. A further description of such cable actuated lift pins can be found in commonly owned U.S. Pat. No. 5,796,066. The lift pin hole 46' is sized to allow movement of the pin and heat transfer gas in the plenum 80 can flow around the lift pin 132 to the underside of a substrate located in overhanging relationship with the chuck body 56".

The heat transfer gas can be supplied to the plenum 80 through a gas passage 138 and the gas in the plenum can be maintained at any suitable pressure such as 2 to 20 Torr. Depending on the size of the substrate, 3 or more lift pins 132 can be used to raise and lower the substrate. As shown in FIG. 3, additional holes 46 can be provided to evenly distribute the gas around the edge of the substrate. Further, the holes can open into a shallow groove (not shown) in the upper surface of the chuck body to aid in distributing the gas under the substrate. In order to provide power to the clamping electrode and the heater element, power supplies 78' can be provided in the interior of the tubular extension 66". Also, one of the power supplies 78' can be used to carry electrical signals to a substrate temperature sensor (not shown) located in the chuck body 56".

With the arrangement shown in FIG. 9, the chuck body 56" can expand when heated and such expansion can be accommodated by the expansion joint 64". The tubular extension 66" is supported freely above the heat transfer body 58" and due to the clamping pressure created by the bolted flange 68", a hermetic seal is maintained between the tubular extension and the heat transfer body 68" by the elastomer seal 90'.

The thin cross-section of the annular section or sections of the expansion joint allows for the thermal isolation of the chuck body from the remainder of the HTESC assembly. By thermally isolating the chuck body and thereby minimizing heat loss due to heat conduction away from the chuck body, the chuck body is capable of reaching temperatures as high as approximately 500° C. without requiring the expenditure of a relatively large amount of electrical power. In addition, the shape of the expansion joint allows the joint to expand and contract as a result of thermal cycling during processing of a substrate. Accordingly, because thermal stresses on welded and brazed joints of the HTESC assembly are minmized, the HTESC can be expected to have a long working life.

By thermally isolating the chuck body from the rest of the HTESC assembly, standard low cost elastomer materials can be used to form vacuum seals with the heat transfer body. Such vacuum seals can be made from a low cost material such as VITON™. The chuck body can be made from cofired layers of ceramic material and metallization layers. For example, commonly owned U.S. Pat. No. 5,880,922 describes a suitable technique for making a ceramic chuck body. For example, the layers can include a conductive layer forming a monopolar or bipolar electrode (which also functions as a RF bias electrode) sandwiched between ceramic layers. A heater element such as one or more spiral resistance heating elements can be located between additional ceramic layers. Various conductive feedthroughs for supplying power to the clamping electrode and heater element can also be incorporated in the chuck body.

While the invention has been described in detail with reference to preferred embodiments thereof, it will be apparent to one skilled in the art that various changes can be made, and equivalents employed, without departing from the scope of the invention.

What is claimed is:

1. A method of processing a substrate in a vacuum process chamber wherein the substrate is electrostatically clamped on a chuck body comprising a clamping electrode and an expansion joint attaching an outer periphery of the chuck body to a heat transfer body such that a plenum is formed between spaced apart surfaces of the chuck body and the heat transfer body, the method comprising:

clamping a substrate on an outer surface of the chuck body by energizing the electrode;

supplying a heat transfer gas to the plenum, the heat transfer gas in the plenum passing through gas passages in the chuck body to a gap between an underside of the substrate and the outer surface of the chuck body;

removing heat from the chuck body by heat conductance through the heat transfer gas supplied to the plenum; and processing the substrate.

2. The method of claim 1, further comprising supplying process gas to the chamber, energizing the process gas into a plasma, and etching an exposed surface of the substrate with the plasma during the processing step.

3. The method of claim 2, wherein the process gas is energized into the plasma by supplying radiofrequency energy to an antenna which inductively couples the radiofrequency energy into the chamber.

4. The method of claim 1, wherein an exposed surface of the substrate is coated during the processing step.

5. The method of claim 1, further comprising heating the substrate above 100° C. by supplying power to a heater element embedded in the chuck body.

6. The method of claim 1, further comprising lowering the substrate onto the outer surface of the chuck body with lift pins mounted on the heat transfer body, the lift pins passing through openings in an outer portion of the chuck body.

7. The method of claim 1, further comprising circulating a liquid coolant in the heat transfer body.

8. The method of claim 1, further comprising monitoring temperature changes in the substrate with a temperature sensor located in a ceramic or metallic tubular section extending from a central portion of the underside of the chuck body, the interior of the tubular section being at atmospheric pressure.

9. The method of claim 1, wherein the substrate is at a temperature of over 80° C. during the processing step.

10. The method of claim 1, wherein the substrate is at a temperature of over 200° C. during the processing step.

11. The method of claim 1, wherein a layer of platinum is plasma etched during the processing step.

12. The method of claim 1, wherein a ceramic or metallic tubular extension extends from a central portion of the underside of the chuck body and conducts heat between the chuck body and the heat transfer body, the method further comprising adjusting pressure of the heat transfer gas in the plenum so that heat removed through a first heat path provided by the heat transfer gas in the plenum balances heat removed through a second heat path provided by the expansion joint and heat removed through a third heat path provided by the tubular extension.

* * * * *